(12) United States Patent
Wortman et al.

(10) Patent No.: US 6,658,700 B2
(45) Date of Patent: Dec. 9, 2003

(54) HINGED-BEZEL SYSTEM FOR USE WITH ELECTRONIC DEVICES

(75) Inventors: Michael Leslie Wortman, Sacramento, CA (US); Stephan Karl Barsun, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 77 days.

(21) Appl. No.: 10/053,008

(22) Filed: Nov. 2, 2001

(65) Prior Publication Data

US 2003/0084542 A1 May 8, 2003

(51) Int. Cl.[7] .............................. E05D 5/02; H05K 5/02
(52) U.S. Cl. ...................... 16/382; 361/724; 312/223.2
(58) Field of Search ........................ 16/382, 383, 270, 16/271, 272, 362, 364; 361/724, 727, 725, 683; 312/223.2, 223.1; 248/213.2, 213.1, 222.14, 224.7

(56) References Cited

U.S. PATENT DOCUMENTS

| | | | | |
|---|---|---|---|---|
| 4,717,216 A | * | 1/1988 | Hornak | 312/326 |
| 5,624,170 A | * | 4/1997 | Hasty | 312/329 |
| 5,926,916 A | * | 7/1999 | Lee et al. | 16/230 |
| 6,038,892 A | * | 3/2000 | Schmitt | 70/78 |
| 6,064,568 A | * | 5/2000 | Schmitt | 361/685 |
| 6,130,822 A | * | 10/2000 | Della Fiora et al. | 361/724 |
| 6,478,392 B2 | * | 11/2002 | Gan et al. | 312/326 |
| 6,519,140 B1 | * | 2/2003 | Kim et al. | 361/683 |

* cited by examiner

*Primary Examiner*—Chuck Y. Mah
*Assistant Examiner*—William D. Hutton, Jr.

(57) ABSTRACT

A hinged-bezel system for use with electronic devices housed in equipment enclosures. The system, comprising a comb, a clamp plate, and a hinged bezel, extends the pivot of a hinge outward from the face of a equipment enclosure to allow full access to components within the equipment enclosure, through the front face of the equipment enclosure, without removing the hinged bezel. Additionally, the system allows the electronic device to be fully anchored to the equipment enclosure. The comb, mounted to the front face of the equipment enclosure, securely fastens to the clamp plate, which is attached to the front sidewall of the electronic device along with the hinged bezel.

1 Claim, 4 Drawing Sheets

HINGED-BEZEL SYSTEM FOR USE WITH ELECTRONIC DEVICES

TECHNICAL FIELD

The present invention relates to bezels and electronic devices, and, in particular, to a hinged-bezel system for an electronic device contained within an equipment enclosure.

BACKGROUND OF THE INVENTION

Typically, electronic devices are housed in standardized equipment enclosures. Many equipment enclosures include an outer housing that is supported by an inner rack. The inner rack commonly comprises a substantially rectilinear metal frame including several vertical columns, each provided with a plurality of mounting and alignment holes that permit the mounting of various components to the inner rack.

Many equipment enclosures also include a removable bezel that forms an aesthetic front face for the enclosure. The bezel may also shield internal components from environmental contaminants, such as moisture and dust, as well as shield the environment from noise generated by components within the enclosure. Removing the bezel provides access to components mounted within the enclosures in order to repair, replace, inspect, and perform maintenance tasks on the components.

Currently, many different designs are employed to attach bezels to equipment enclosures. Most bezel designs require complete removal of the bezel in order to provide access to electronic components through the front of the equipment enclosure. Some bezel designs employ a hinge to open the bezel, thus allowing access to the interior of the equipment enclosure without complete removal of the bezel. However, pivot-location problems plague current hinged-bezel designs. The optimal pivot location is along the extreme front edge of the enclosure. However, electronic devices often fit snugly into equipment enclosures, with the front of the electronic devices flush with the openings of the equipment enclosures. Optimal pivot location obstructs, or shadows, the vertical column of the rack that the pivot lies upon, thus prohibiting the anchoring of one edge of the electronic device to the rack. Insufficiently anchored electronic devices are prone to damage when moved, and fail to comply with certain shake, vibration, drop, and earthquake standards.

Some current hinged-bezel designs have attempted to place the pivot in less than optimal locations to allow complete anchoring of the electronic device to the equipment enclosure, and also to avoid shadowing rack rails. However, pivots not placed along the extreme edge of the front face of the equipment enclosure either protrude beyond the front face of the enclosure, thereby reducing the types of racks available for mounting, or fail to open fully, thus requiring complete bezel removal for access to some components within the equipment enclosure. For these reasons, designers, manufacturers and consumers of electronic devices have recognized the need for a hinged-bezel system for an equipment enclosure, capable of providing unobstructed access to components within an equipment enclosure without removal of the bezel, while providing accessible mounts for anchoring the electronic device to the inner rack of the equipment enclosure.

SUMMARY OF THE INVENTION

The present invention relates to hinged-bezel systems for equipment enclosures. One embodiment of the present invention allows for unobstructed access to components through the front face of an equipment enclosure without removing a bezel, while still allowing for the complete anchoring of an electronic device within the equipment enclosure.

The hinged-bezel system comprises a hinged bezel, a clamp plate, and a comb. The bezel hinge fastens to the clamp plate attached to the front edge of the vertical length of one side of the electronic device. The clamp plate extends beyond the plane of the front face of the electronic device. Thus, the bezel hinge is attached to the electronic device while also being extended outward, via the clamp plate, from the face of the electronic device. By extending the bezel hinge outward, the bezel can swing open far enough to allow full access to the various components within the equipment enclosure.

The comb, attached to a vertical column near the front face of the equipment enclosure, contains several fingers that extend outward from the front face of the equipment enclosure. When the electronic device is placed into the equipment enclosure, the fingers on the comb slide underneath several guide channels on the clamp plate. A locking screw passes through a hole in one finger of the comb, and into a nut pressed into one of the guide channels of the clamp plate, thus anchoring the electronic device to the equipment enclosure.

DETAILED DESCRIPTION OF THE INVENTION

The present invention is a hinged-bezel system for use with electronic devices contained within equipment enclosures. The system allows unobstructed access to components within an equipment enclosure through the front face of the equipment enclosure, without requiring removal of the bezel, while still allowing complete anchoring of the electronic device to the equipment enclosure.

Figure 1:
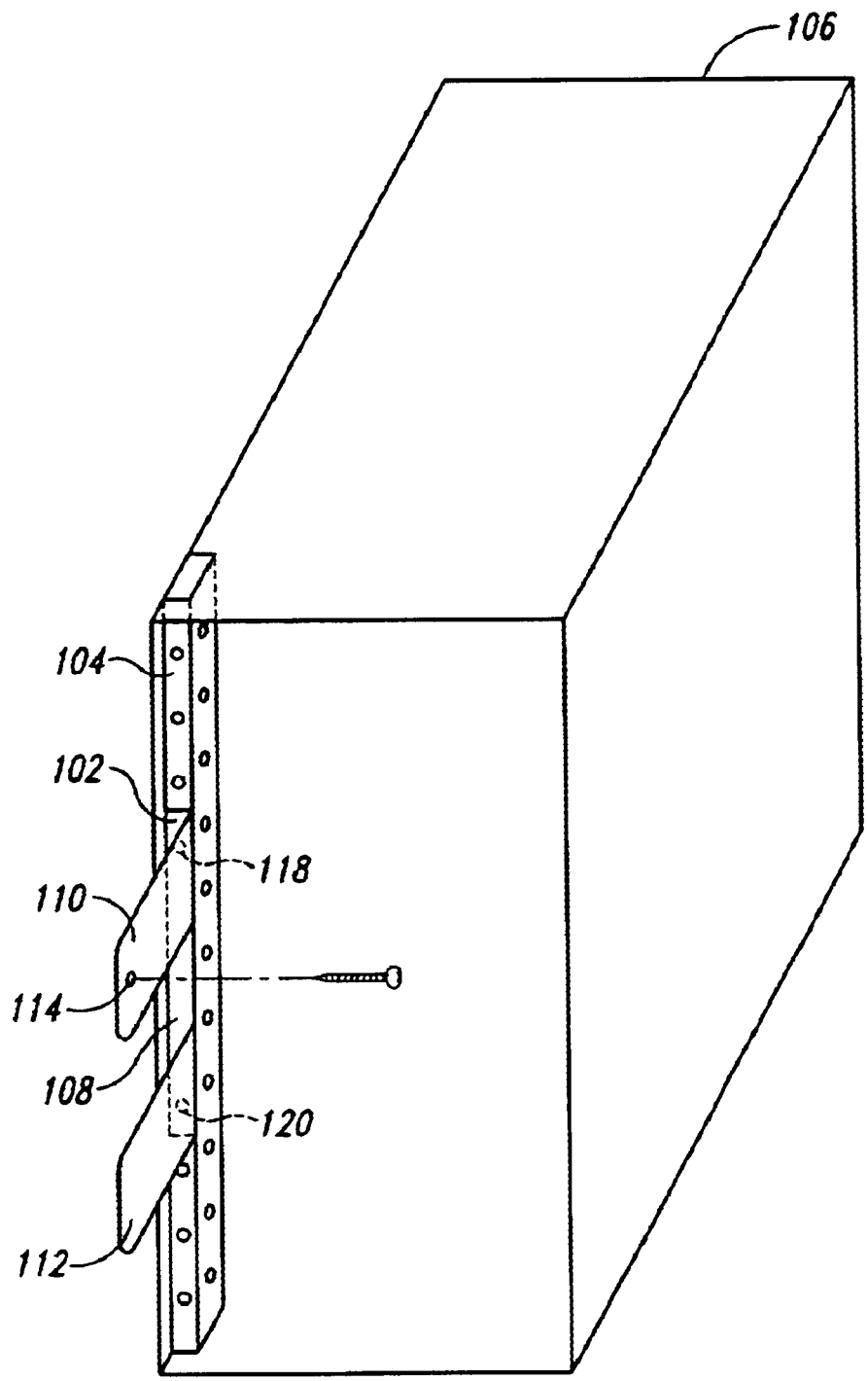
FIG. 1 is a perspective view illustrating a comb attached to the left, front vertical column of an inner rack within an equipment enclosure.
Figure 2:
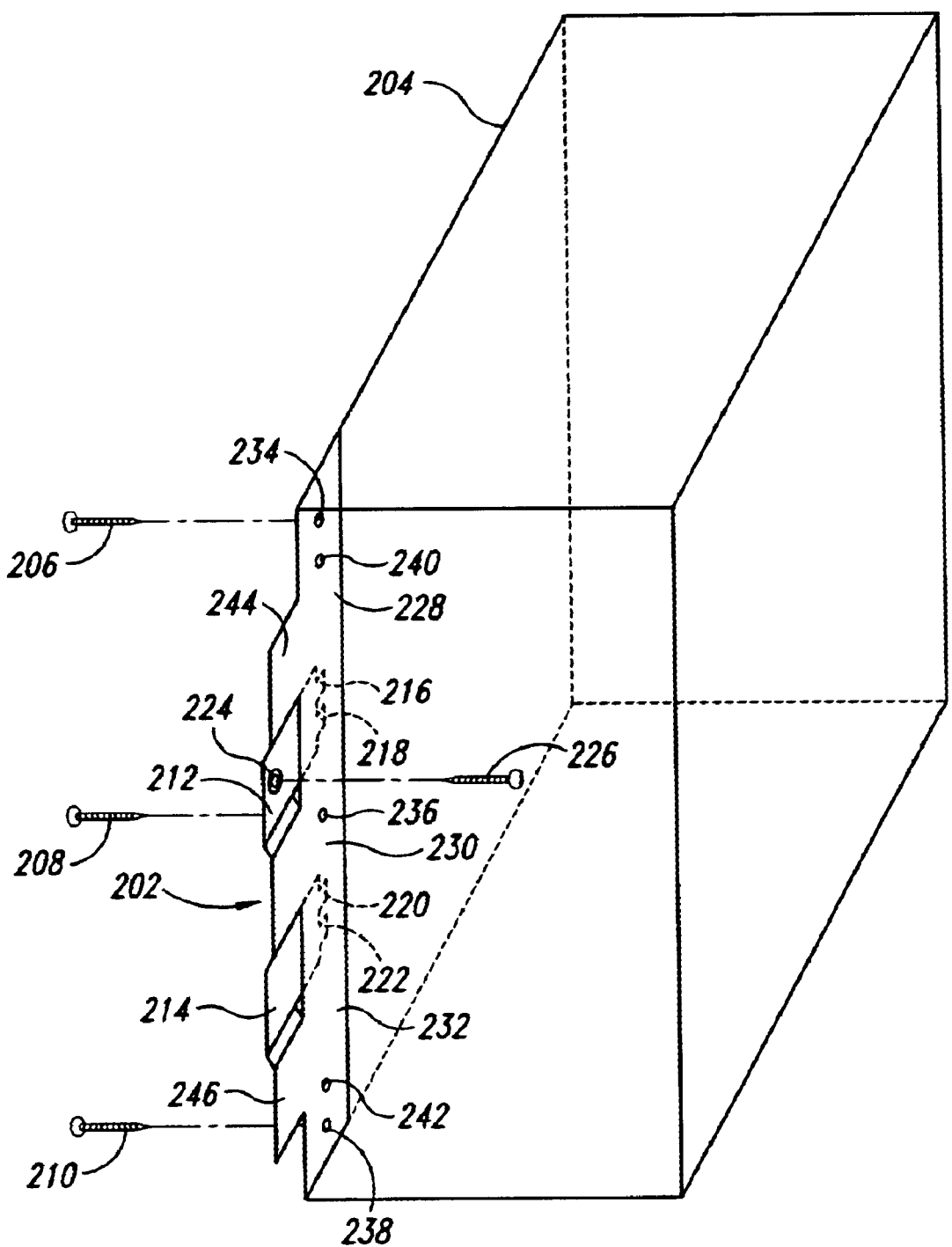
FIG. 2 is a perspective view showing a single-piece clamp plate mounted to the front edge of the left side of an electronic device by three screws.
Figure 3:
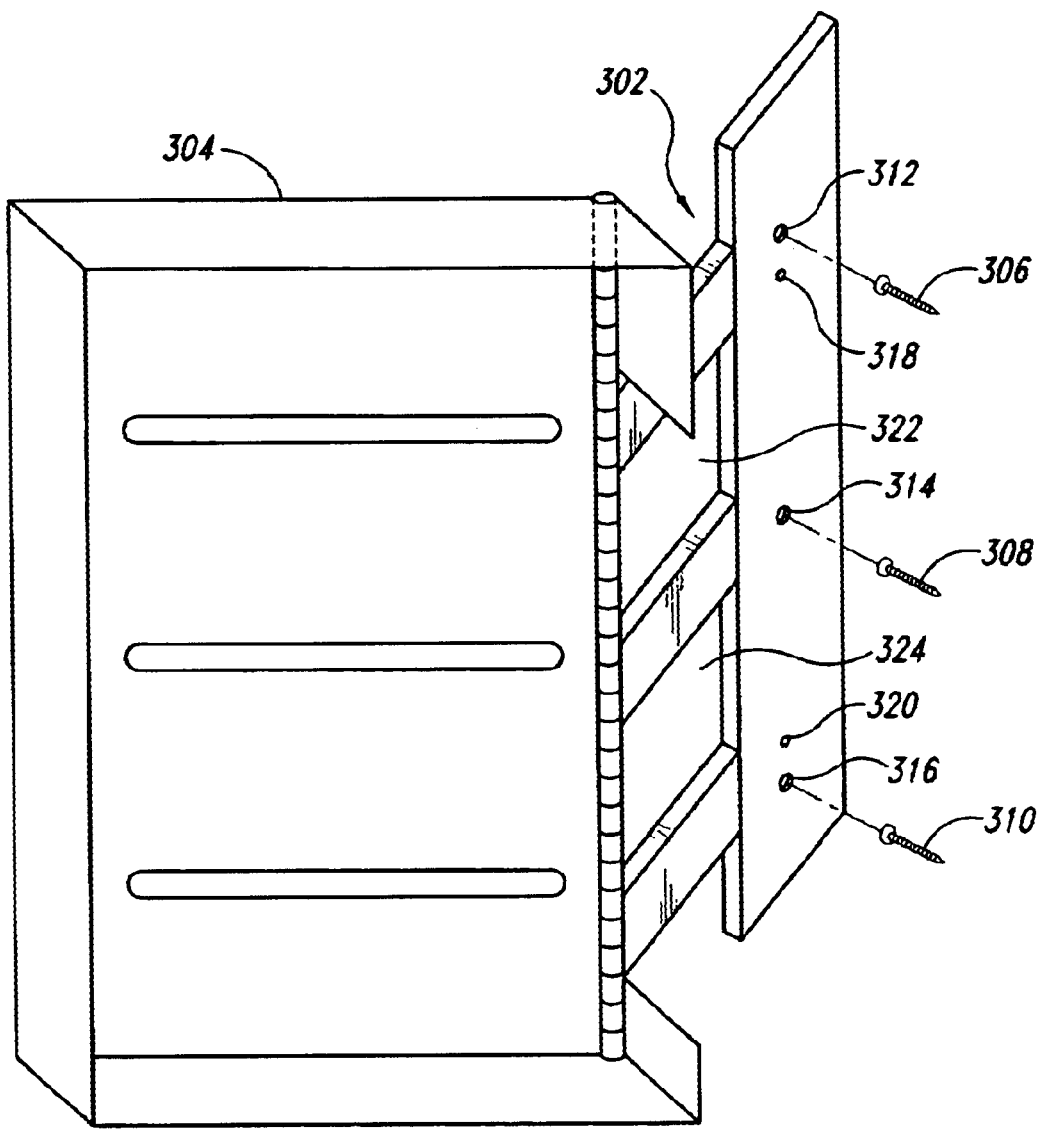
FIG. 3 is a perspective view illustrating a hinge attached to the right side of a bezel when viewed from the interior side of the bezel.

In one embodiment of the present invention, shown in FIGS. 1–3, the hinged-bezel system comprises a hinged-bezel, a comb, and a clamp plate. FIG. 1 is a perspective view illustrating a comb 102 attached to a vertical column near the front face of the inner rack 104 of the equipment enclosure 106. The comb 102 is a thin, flat strip of metal comprising a mounting flange 108 and two fingers 110,112. The mounting flange 108 extends the length of the strip, and comprises two screw holes 118,120 that align with mounting holes on the front face of a vertical column of the rack 104, extending along the edge of the equipment enclosure 106. The two fingers 110,112 extend outward from the front face of the equipment enclosure 106 and parallel with the sidewall of the equipment enclosure 106. The upper finger 110 further contains a clearance hole 114 for attachment to the clamp plate, as discussed below.

FIG. 2 shows a single-piece clamp plate 202 mounted to the front edge of the left side of the electronic device 204, by three screws 206,208, and 210. The clamp plate 202 comprises a flat strip of metal with two raised-sections, an upper guide channel 212 and a lower guide channel 214. The two guide channels 212,214 each contain two lead-in details 216,218,220, and 222 along the edge facing away from the front of the electronic device 204 when the clamp plate 202 is mounted to the electronic device 204. As an electronic device 204 is placed into the equipment enclosure, the lead-in details 216,218,220, and 222 facilitate alignment of the comb with the clamp plate 202. Additionally, the lead-in details 216,218,220, and 222 minimize jams created by mounting equipment protruding from the rack when placing the electronic device 204 into the equipment enclosure.

As the electronic device 204 is placed into the equipment enclosure, the two fingers of the comb slide along the left side of the electronic device 204 until the electronic device 204 is fully inside the equipment enclosure. As the electronic device 204 reached a final flush position, the two fingers of the comb slide underneath the two guide channels. The upper guide channel 212 of the clamp plate 202 contains a nut 224 pressed into the metal. Once the electronic device 204 is fully inside the equipment enclosure, a locking screw 226 may be used to securely attach the comb to the clamp plate 202. The locking screw 226 passes through the clearance hole in the upper finger of the comb and into the nut 224 in the upper guide channel 212 of the clamp plate 202, thereby effectively anchoring the electronic device to the equipment enclosure.

The clamp plate 202 further contains three flat, non-raised sections 228,230, and 232. Each of the three sections 228, 230, and 232 contains a screw hole 234, 236, and 238 facilitating the attachment, by three screws 206, 208, and 210, of both the clamp plate 202 to the electronic device 204 and the clamp plate 202 to the bezel hinge. The upper, non-raised section 228 and the lower, non-raised section 232 each further contains a hole 240,242 to receive a pin protruding from the molded bezel-hinge.

The upper, non-raised section 228 and the lower, non-raised section 232 of the late 202 are flush with the front edge of the electronic device 204. However, the clamp plate 202 contains a wide section between two shoulders 244,246 that extends outward from the face of the electronic device 204. The wide section of the clamp plate 202 comprises the middle, non-raised section 230, and the two guide channels 212, 214. Note that the pressed nut 224 on the upper guide channel is extended outward from the face of the electronic device, while the screw hole 236 in the middle non-raised section 230 of the clamp plate 202 is not. The screw hole 236 in the middle section is not extended outward so that the screw 208 can pass through the clamp plate 202 and into the electronic device 204. The pressed nut 224 is extended outward to allow a screwdriver, or other similar tool, to tighten the screw 226, thus anchoring the clamp plate 202 to the comb when the electronic device 204 is fully inside the equipment enclosure.

FIG. 3 illustrates a hinge 302 attached to the right side of the bezel 304 when viewed from the interior side of the bezel 304. The general shape of the interior of the hinge 302 corresponds with the shape of the clamp plate to promote a close mount to the clamp plate. The bezel hinge 302 attaches to the front edge of the left side of the electronic device by passing three screws 306, 308, and 310 through three screw holes 312, 314, and 316 spaced vertically, along the length of the hinge 302, and also through corresponding holes in the clamp plate and into the electronic device. Additionally, in one embodiment, the hinge 302 further includes two pinholes 318,320 to facilitate alignment of the hinge 302 and clamp plate. The hinge 302 also contains an upper recess 322 and a lower recess 324. The two recesses 322,324 allow space for the upper and lower guide channels of the clamp plate to fit into, while the hinge 302 is attached to the clamp plate.

Figure 4:
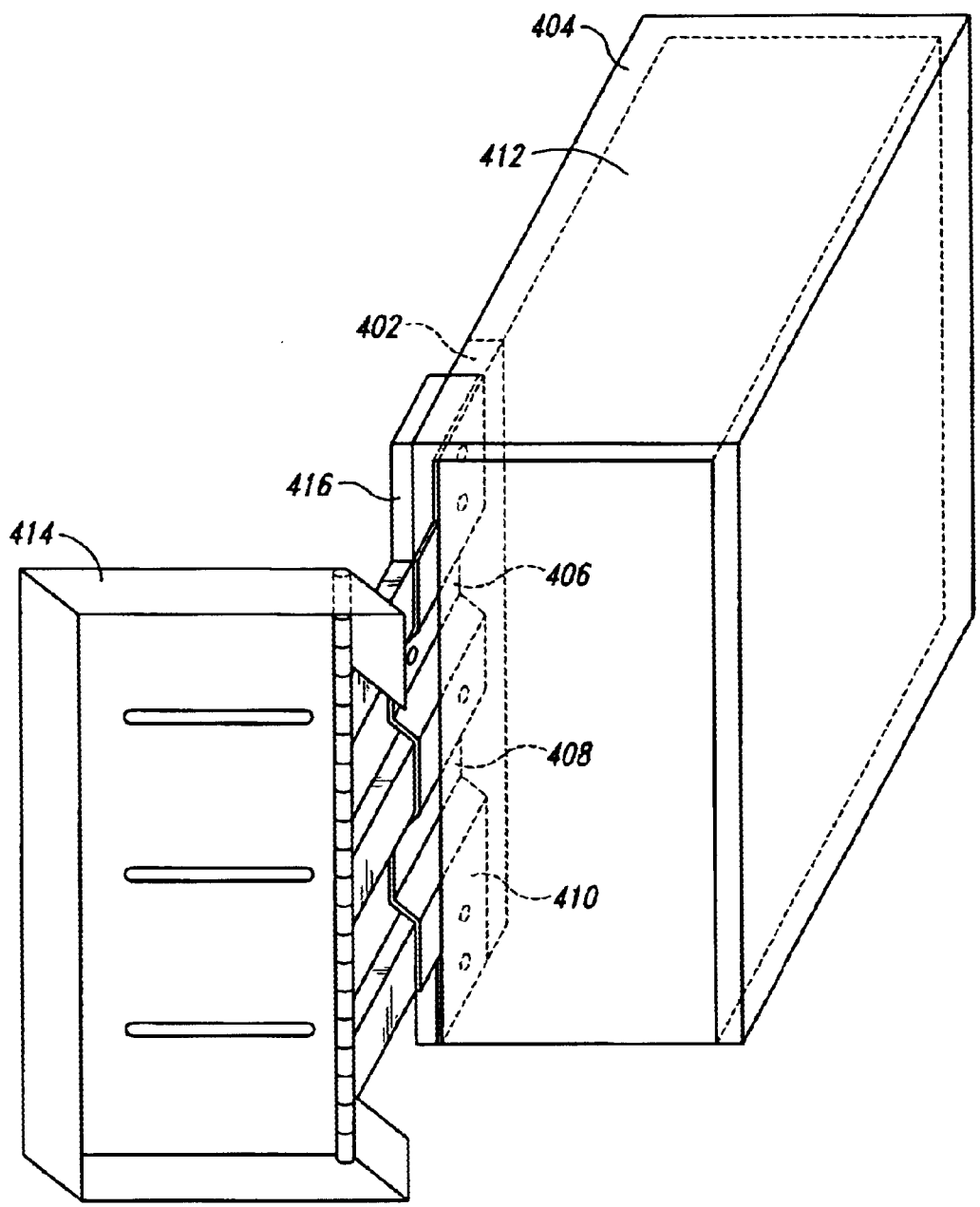
FIG. 4 is a perspective view of the hinged-bezel system attached to an equipment enclosure and electronic device.

FIG. 4 is a perspective view of the hinged-bezel system attached to an equipment enclosure and electronic device. The comb, mounted onto a vertical column 402 within an equipment enclosure 404, contains two fingers 406,408. The two fingers 406,408 are held under two guide channels on the clamp plate 410. The clamp plate 410 is attached to the electronic device 412, which is inside of the equipment enclosure 404. The bezel 414 contains a hinge 416 that is connected to the clamp plate 410.

Although the present invention has been described in terms of a particular embodiment, it is not intended that the invention be limited to this embodiment. Modifications within the spirit of the invention will be apparent to those skilled in the art. For example, the hinged-bezel system may be positioned along any front edge of the electronic device and equipment enclosure. The hinged-bezel system may require modifications to accommodate electronic devices and equipment enclosures of different shapes and sizes. For instance, a relatively large equipment enclosure may require a comb with more than two fingers. Consequently, more than two guide channels in the clamp plate and recesses within the hinge would also be necessary for use on a large equipment enclosure. The comb and clamp plate may also require a variable number of anchoring holes and surfaces, and may be attached by other methods than a locking screw.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A hinged-bezel system for an equipment enclosure, containing one or more components, comprising:

a comb, connected to the equipment enclosure, having one or more fingers;

a clamp plate, attached to a component, adapted to receive the one or more fingers of the comb in order to secure the component within the equipment enclosure, the clamp plate including one or more guide channels and two or more lead-in details extending from each guide channel; and a bezel that includes a hinge mounted to the clamp plate.

* * * * *